(12) United States Patent
Coimbra et al.

(10) Patent No.: US 11,521,693 B2
(45) Date of Patent: Dec. 6, 2022

(54) SAMPLE AND HOLD CIRCUIT FOR CURRENT

(71) Applicant: NXP B.V., Eindhoven (NL)

(72) Inventors: Ricardo Pureza Coimbra, Campinas (BR); Mateus Ribeiro Vanzella, Campinas (BR); Luis Enrique Del Castillo, Campinas (BR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/649,443

(22) Filed: Jan. 31, 2022

(65) Prior Publication Data

US 2022/0254424 A1    Aug. 11, 2022

(30) Foreign Application Priority Data

Feb. 5, 2021 (EP) ..................................... 21155462

(51) Int. Cl.
   *G11C 27/02* (2006.01)
(52) U.S. Cl.
   CPC .......... *G11C 27/026* (2013.01); *G11C 27/028* (2013.01)
(58) Field of Classification Search
   None
   See application file for complete search history.

(56) References Cited

U.S. PATENT DOCUMENTS

| | | | |
|---|---|---|---|
| 5,227,676 A * | 7/1993 | Bahr | G11C 27/028 327/362 |
| 5,296,752 A | 3/1994 | Groeneveld et al. | |
| 5,349,305 A * | 9/1994 | Hsiao | H03F 3/45753 330/253 |
| 6,549,043 B2 * | 4/2003 | Roovers | G11C 27/024 327/94 |
| 6,747,891 B2 * | 6/2004 | Hoffmann | G11C 11/16 365/158 |
| 8,072,259 B1 * | 12/2011 | Isik | G05F 3/242 327/512 |
| 8,305,068 B2 * | 11/2012 | Camacho Galeano | G05F 3/262 323/313 |
| 8,896,349 B2 * | 11/2014 | Vilas Boas | G01R 19/32 327/513 |
| 9,997,207 B2 | 6/2018 | Dayley et al. | |
| 10,469,776 B2 * | 11/2019 | Finateu | H04N 5/3745 |
| 10,784,917 B2 * | 9/2020 | Easwaran | H03K 5/24 |

FOREIGN PATENT DOCUMENTS

EP     2533128 B1    1/2014

* cited by examiner

*Primary Examiner* — Thomas J. Hiltunen (57) ABSTRACT

A sample and hold circuit configured to sample a current includes an input node to receive the current, a capacitor coupled with a sampling node and a reference voltage node, switch between the input node and the sampling node, a controlled current source coupled to the input node, a current mirror circuit having connections each providing a mirrored current, wherein at least one of said connections provides an output node, and a transistor arrangement. The transistor arrangement includes a control MOSFET in series with a series connected chain of cascaded cells. The control MOSFET and each of said cascaded cells are coupled to the current mirror circuit and each of the cascaded cells includes a pair of MOSFETs arranged to provide a voltage difference including a difference between a gate-source voltage of a first of the pair and a gate-source voltage of a second of the pair.

15 Claims, 7 Drawing Sheets

SAMPLE AND HOLD CIRCUIT FOR CURRENT

CROSS-REFERENCE TO RELATED APPLICATIONS

This application claims the priority under 35 U.S.C. § 119 of European Patent application no. 21155462.1, filed on 5 Feb. 2021, the contents of which are incorporated by reference herein.

FIELD

The present disclosure relates to a sample and hold circuit for sampling current signals, also known as a current memory.

BACKGROUND

A sample and hold circuit may be used to sample a current during a sample phase and provide the current during a hold phase.

SUMMARY

According to a first aspect of the present disclosure there is provided sample and hold circuit configured to sample a current comprising:
  an input node configured to receive the current to be sampled;
  a reference voltage node configured to be coupled to a reference voltage;
  a capacitor having a first plate coupled with a sampling node and a second plate coupled to the reference voltage node;
  a switch configured to open and close a connection between the input node and the sampling node;
  a controlled current source having a first terminal coupled to said input node and a second terminal coupled to the reference voltage node;
  a current mirror circuit having a plurality of connections each providing the same or a proportional mirrored current, wherein at least one of said plurality of connections provides an output node of said sample and hold circuit;
  a transistor arrangement coupled between the sampling node and the reference voltage node, the transistor arrangement comprising a control MOSFET coupled in series with a cascade structure, the cascade structure comprising one or more cascaded cells coupled in a series connected chain, wherein said control MOSFET is coupled to one of said plurality of connections of the current mirror circuit and each of said cascaded cells are coupled to one of said plurality of connections of the current mirror circuit, each of the one or more cascaded cells comprising at least a pair of MOSFETs arranged to provide a voltage difference between a first cell terminal and a second cell terminal of the cascaded cell, the voltage difference comprising a difference between a gate-source voltage of a first of the pair and a gate-source voltage of a second of the pair wherein said first cell terminal and said second cell terminal provide at least connections to either an adjacent cascaded cell in said series connected chain or, for one of the cascaded cells at an end of the series connected chain, to the control MOSFET; wherein the sample and hold circuit is configured to operate in a sample phase in which said switch is closed and the controlled current source is configured to provide a current based on the current provided at the plurality of connections of the current mirror circuit and wherein a closed-loop is formed by the transistor arrangement, the current mirror circuit and the current controlled current source wherein, by feedback, the capacitor is thereby charged to a voltage, Vc, that results in the current provided by the controlled current source being equal to the current to be sampled; and wherein the sample and hold circuit is configured to operate in a hold phase in which said switch is open and the voltage at the capacitor applied to said transistor arrangement provides for output of an output current at the output node representative of the sampled current.

In one or more embodiments, the control MOSFET has a negative temperature coefficient thereby acting to increase the current at the output node for a given voltage at the capacitor with increasing temperature; and
  the one or more cascaded cells have a positive temperature coefficient thereby acting to decrease the current at the output node for a given voltage at the capacitor with increasing temperature; and
  wherein a net temperature coefficient of the cascade structure is configured to be one or more of: greater than that of the temperature coefficient of the control MOSFET; and substantially equal to the magnitude of the temperature coefficient of the control MOSFET.

In one or more embodiments, one or more cascaded cells comprises:
  a first MOSFET having a drain terminal coupled to said one of said plurality of connections of the current mirror circuit and a second MOSFET, wherein a gate terminal of the first MOSFET and a gate terminal of the second MOSFET are coupled to the drain terminal of the first MOSFET, and wherein a source terminal of the first MOSFET is coupled to a first cell terminal, a drain terminal of the second MOSFET is coupled to said first cell terminal and a source terminal of the second MOSFET provides a second cell terminal, said first cell terminal and said second cell terminal providing connections to and from said cascaded cell.

In one or more embodiments, based on a position of the cascaded cell in the chain, one of;
  said first cell terminal is configured to couple to a source terminal of the control MOSFET and the second cell terminal is configured to couple to the first cell terminal of an adjacent cascaded cell of the chain or the reference voltage node; and
  said first cell terminal is configured to couple to a second cell terminal of an adjacent cascaded cell of the chain and the second cell terminal is configured to couple to the first cell terminal of an adjacent cascaded cell or the reference voltage node.

In one or more embodiments, wherein one of:
  the sample and hold circuit is configured such that the current to be sampled is input at the input node and the controlled current source is configured to sink current, wherein, in the sample phase, the capacitor voltage comprising Vc results in the current sunk by the controlled current source being equal to the current input at the input node; and
  the sample and hold circuit is configured such that the current to be sampled is sunk from the input node and the controlled current source is configured to input current, wherein, in the sample phase, the capacitor voltage comprising Vc results in the current input by the controlled current source being equal to the current sunk at the input node.

In one or more embodiments, one or more cascaded cells comprises:
  a parallel arrangement of a first branch and a second branch coupled at a first end node and a second end node, wherein the first branch comprises a first MOSFET and a fourth MOSFET and the second branch comprises a second MOSFET and a third MOSFET,
  wherein a source terminal of the fourth MOSFET is coupled to the first end node and a drain terminal of the fourth MOSFET is coupled to drain terminal of the first MOSTFET and a source terminal of the first MOSFET is coupled to the second end node where the first branch and second branch couple together,
  wherein a source terminal of the third MOSFET is coupled to the first end node and a drain terminal of the third MOSFET is coupled to drain terminal of the second MOSTFET and a source terminal of the second MOSFET is coupled to the second end node,
  wherein gate terminals of both the third MOSFET and the fourth MOSFET are both coupled to the drain terminal of the third MOSFET, wherein the drain terminal and the gate terminal of the first MOSFET are coupled together, and
  wherein a gate terminal of the second MOSFET provides a first cell terminal and the gate terminal of the first MOSFET provides a second cell terminal.

In one or more embodiments, based on a position of the cascaded cell in the chain, one of;
  said second cell terminal is configured to couple to a source terminal of the control MOSFET and the first cell terminal is coupled to the second cell terminal of an adjacent cascaded cell of the chain or the reference voltage node; and
  said second cell terminal is configured to couple to a first cell terminal of an adjacent cascaded cell in the chain and the first cell terminal is configured to couple to the reference voltage node.

In one or more embodiments, based on a position of the cascaded cell in the chain, one of;
  said first cell terminal is configured to couple to the sampling node and the second cell terminal is configured to couple to the first cell terminal of an adjacent cascaded cell of the chain or is coupled to a gate terminal and a drain terminal of the control MOSFET;
  the first cell terminal is configured to couple to the second cell terminal of an adjacent cascaded cell of the chain and the second cell terminal is coupled to a gate terminal and a drain terminal of the control MOSFET.

In one or more embodiments, one of:
  (i) the control MOSFET has a gate terminal, a drain terminal and a source terminal, wherein said gate terminal is coupled to the sampling node, the drain terminal is coupled to said one of said plurality of connections of the current mirror circuit and the source terminal is coupled to a first of the one or more cascaded cells; and
  (ii) the control MOSFET has a gate terminal, a drain terminal and a source terminal, wherein said gate terminal and the drain terminal are coupled to a first of the one or more cascaded cells, and the source terminal is coupled to said reference voltage node.

In one or more embodiments, the controlled current source comprises:
  a first MOSFET having a drain terminal coupled to said input node and a source terminal coupled to a drain terminal of a second MOSFET, wherein the source terminal of the second MOSFET is coupled to the reference voltage node, and wherein gate terminals of both the first MOSFET and the second MOSFET are coupled to the gate terminal of the first MOSFET of one of the one or more cascaded cells.

In one or more embodiments, the controlled current source is provided by the current mirror circuit such that said one of said plurality of connections of the current mirror circuit is coupled to the input node. In one or more embodiments, current to be sampled is sunk at the input node.

In one or more embodiments, the current mirror circuit includes a further current mirror circuit part and the controlled current source is provided by said further current mirror circuit part, the further current mirror circuit part having a first leg coupled to the input node and a second leg coupled to said one of said plurality of connections of the current mirror circuit.

In one or more embodiments, the further current mirror circuit part includes a third leg configured to provide the same or a proportional current as the first leg and the second leg, wherein the third leg includes a terminal comprising one of: the output node of the sample and hold circuit or a second output node of the sample and hold circuit, wherein the third leg thereby comprises one of the plurality of connections of the current mirror circuit.

In one or more embodiments, an amplifier is provided between the input node and the sampling node, the amplifier having a first terminal coupled to the input node and the controlled current source and a second terminal coupled to receive a bias voltage, an output of the amplifier coupled to the sampling node.

According to a second aspect of the disclosure we provide a device including the sample and hold circuit of the first aspect and a current reference source circuit configured to provide the current to be sampled at the input node and wherein in the hold phase, the current reference source circuit is unpowered.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Figure 1:
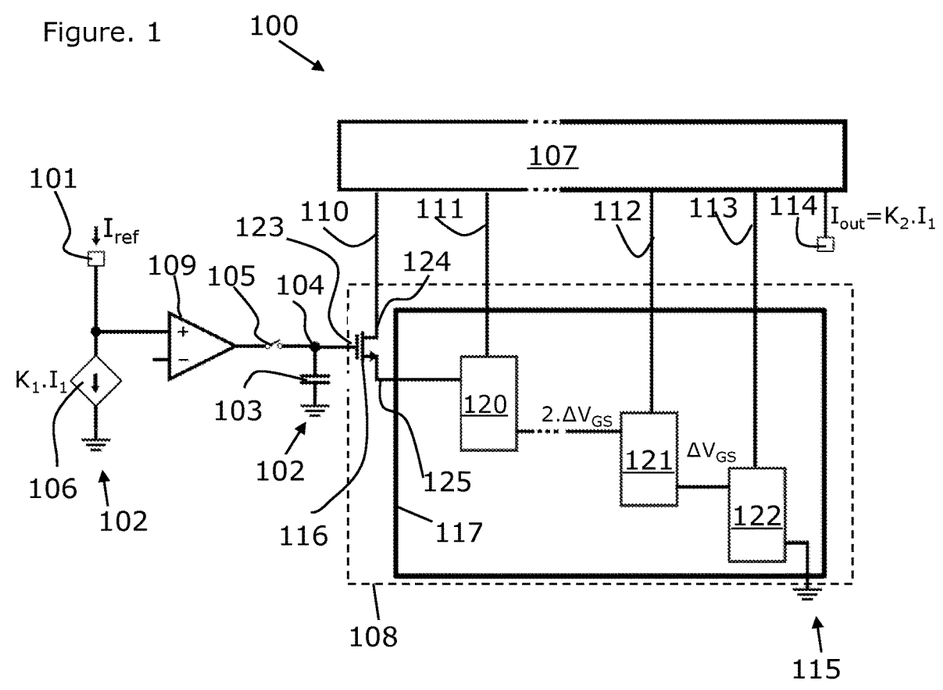
FIG. 1 shows a first example embodiment of a sample and hold circuit

Example FIG. 1 shows a sample and hold circuit 100 configured to sample a current comprising an input node 101 configured to receive the current to be sampled, shown as Iref. In this example the current to be sampled flows into the input node 101. The circuit 100 further comprises a reference voltage node 102 configured to be coupled to a reference voltage when the circuit is in use. The reference voltage may be ground.

The circuit 100 further comprises a capacitor 103 having a first plate coupled with a sampling node 104 and a second plate coupled to the reference voltage node 102.

The circuit 100 further comprises a switch 105 configured to open and close a connection between the input node 101 and the sampling node 104.

The circuit 100 further comprises a controlled current source 106 having a first terminal coupled to said input node 101 and a second terminal coupled to the reference voltage node 102. In this example, the controlled current source is configured to sink at least some of the current to be sampled. The controlled current source 106 is configured to be controlled by circuitry coupled to the sampling node 104 described below.

The circuit 100 further comprises a current mirror circuit 107 having a plurality of connections 110, 111, 112, 113, 114, each providing the same mirrored (i.e. copied and therefore the same current flow) current, as will be understood by those skilled in the art of current mirror circuits. It will be appreciated that current mirror circuits may be configured to provide currents equal to or proportional to the current mirror circuit's input current and therefore in other embodiments, the connections 110, 111, 112, 113, 114, may provide equal or proportional currents. At least one of said plurality of connections (one in this example but could be two or more) provides an output node 114 of said sample and hold circuit 100.

The circuit 100 further comprises a transistor arrangement 108 coupled between the sampling node 104 and the reference voltage node 115. The transistor arrangement 108 comprises a control MOSFET 116 coupled in series with a cascade structure 117. In particular, in this example, the cascade structure 117 is coupled between the source terminal of the control MOSFET 116 and the reference terminal node 115. However, in the example of FIG. 3, described below, a different arrangement is shown.

The cascade structure 117 comprises one or more cascaded cells 120, 121, 122 coupled in a series connected chain. Each cascaded cell 120, 121, 122 of the chain may be configured to receive the current through the control MOSFET and the current from the current mirror 107 and any preceding cascaded cells in the chain. Thus, the first cascaded cell 120 is coupled to said connection 111. The second cascaded cell 120 is coupled to said connection 112 of the current mirror and the third cascaded cell 122 is coupled to said connection 113 of the current mirror 107.

The control MOSFET 116 is coupled to one of said plurality of connections 110 of the current mirror circuit. In this example it is coupled directly to connection 110. In this and other examples, the control MOSFET 116 provides the input current for the current mirror circuit 107 and thus connection 110 may be considered the input connection. Accordingly, connections 111 to 114 comprise outputs of the current mirror circuit 107.

Various embodiments of the each of the one or more cascaded cells 120, 121, 122 will be described in relation to FIGS. 4 to 9. However, in general, each of the one or more cascaded cells comprising at least a pair of MOSFETs arranged to provide a voltage difference, $\Delta V_{GS}$, between terminals of the cascaded cell comprising a difference between a gate-source voltage of a first of the pair and a gate-source voltage of a second of the pair. Said terminals of the cell are coupled to either an adjacent cascaded cell or, for a final cascaded cell in the series connected chain (e.g. cell 120 in this example), to the control MOSFET 116.

The sample and hold circuit 100 is configured to operate in a sample phase in which said switch 105 is closed and the controlled current source 106 is configured to provide (e.g. sink in this example) a current based on the current provided at the plurality of connections 110, 111, 112, 113 of the current mirror circuit. In this configuration, a closed-loop is formed wherein, by force of feedback, capacitor 103 is charged to a voltage level Vc that results in current sunk by controlled current source 106 being equal to input current Iref provided at input node 101. Voltage Vc at the capacitor 103 is based on a sum of the gate-source voltage of the control MOSFET and a sum of said voltage differences provided by the one or more cascaded cells 120, 121, 122. Thus, the voltage at the capacitor 103, Vc, is given by $Vc=V_{GS\_control\_MOSFET}+N\cdot\Delta V_{GS}$, where $V_{GS\_control\_MOSFET}$ is the gate-source voltage of the control MOSFET 116, N is the number of cascaded cells of the cascade structure 117 and $\Delta V_{GS}$ is said voltage difference between terminals of each cascaded cell 120, 121, 122, which is the same for all the cascaded cells.

Further, the sample and hold circuit 100 is configured to operate in a hold phase in which said switch 105 is open and the previously sampled voltage Vc at the capacitor 103/sampling node 104 remains applied to said transistor arrangement 108. Consequently, the transistor arrangement 108 in combination with the current mirror circuit 107 continues to provide for output of an output current $I_{out}$ at the output node 114 that is representative of the sampled current-to-be-sampled.

In one or more examples, the sample and hold circuit includes an optional amplifier 109 between the input node 101 and the sampling node 104. The amplifier has a first terminal (the non-inverting terminal in this example) coupled to the input node 101 and the controlled current source 106 and a second terminal (the inverting terminal in this example) coupled to receive a bias voltage. During the sampling phase, the voltage at the first terminal of the amplifier will stabilize near the bias voltage level. Hence, the bias voltage is chosen as any convenient voltage level for proper biasing of "branch" comprising the input node 101, controlled current source 106 and reference voltage node 102. Alternatively, the inverting terminal could be connected to its output node (amplifier configured as a buffer). An output of the amplifier 109 is coupled to the sampling node 104.

In one or more examples the circuit 100 operates cyclically alternating operation between the sample phase and the hold phase.

During the sample phase, switch 105 is closed and all circuit elements, including a current reference source circuit (not shown) that may provide the current-to-be-sampled at 101 are active (i.e. powered). A closed-loop is formed such that voltage $V_C$ is driven to the value that makes the current through the controlled current source, $K_1 \cdot I_1$, where $K_1$ is a scaling factor, equal to the current-to-be-sampled $I_{REF}$. In examples that include the amplifier 109, the gain in the closed-loop may be increased, which may be advantageous in some examples. Therefore, output current $I_{OUT}$ becomes given by:

$$I_{OUT} = \left(\frac{K2}{K1}\right) I_{REF}$$

Where K2 is a further scaling factor. In some embodiments, scaling factors K1 and K2 correspond to current mirror circuit 107 gain factors.

And the sampled value of $V_C$ as mentioned above is given by:

$$V_C = V_{GS1} + N \cdot \Delta V_{GS}$$

During the hold phase, switch 105 is opened and all circuitry to the left of the switch 105, namely the controlled current source 106 and the current reference source circuit (not shown) can be turned-off to save power. The control MOSFET 116 continues to be biased by voltage $V_C$ previously sampled on the capacitor 103. The duration of the hold phase is typically desired to be long to achieve minimum power consumption. The main constraint for a long hold phase is the time during which voltage $V_C$ is guaranteed to remain steady, i.e., during which leakage losses are negligible. In the present embodiment, temperature drifts during the hold phase may cause negligible effects in view of the very low output temperature sensitivity that the example embodiment circuit 100 may provide.

In summary, the control MOSFET 116 provides the input current, I1, to current mirror 107. Current I1 (of connection 110) is the current produced by the control MOSFET 116 when biased with $V_{GS1} = V_C - N \cdot \Delta V_{GS}$. Hence, the I1 value depends on the control MOSFETs $I(V_{GS})$ relation and on the term "$N \cdot \Delta V_{GS}$" produced by the cascade of cells 120, 121, 122. Thus, in the closed loop formed by closing of the switch 105, all elements (116, 120-121, 107) may affect the I1 value. From another perspective, the closed-loop formed during the sample phase dynamically adjusts Vc while $N \cdot \Delta V_{GS}$ remains approximately constant, i.e., it will mainly adjust the gate-source voltage for the control MOSFET 116 for the control MOSFET 16 to produce I1=Iref.

Thus, the sample and hold circuit 100 of the present embodiment may be advantageous in terms of its response to temperature. In particular, the transistor arrangement 108 provides for control of the current provided at the output terminal 114 by acting through the current mirror circuit 107. As described above, the voltage at the capacitor, Vc, is applied to the transistor arrangement 108 and wherein $V_{GS1}$ produced by the control MOSFET has a negative temperature coefficient and $N \cdot \Delta V_{GS}$ produced by the one or more cascaded cells of the cascade structure 117 have a positive temperature coefficient. Thus, as temperature changes, the output current at 114 remains stable while $Vc = V_{GS1} + N \cdot \Delta V_{GS}$ remains at a fixed level because the positive thermal coefficient of $N \cdot \Delta V_{GS}$ compensates for the negative thermal coefficient of $V_{GS1}$. This behavior is illustrated in FIG. 2, described below.

In one or more examples, the net change in voltage caused by the cascade structure 117 is configured to substantially complement (i.e. cancel out) the change in voltage caused by the control MOSFET 116. Accordingly, the current provided at the output terminal 114 will be stable to changes in temperature during the HOLD phase. As seen in FIG. 2, the $V_C$ voltage that sustains a constant value of $I_{OUT}$ at terminal 114 is approximately constant at an interval over which temperature could drift during the hold phase. This is because the negative thermal coefficient of $V_{GS1}$ may be compensated by the positive thermal coefficient of $N \cdot \Delta V_{GS}$.

However, in general, it will be appreciated that an improvement in temperature stability can be achieved when the net change in voltage caused by the cascade structure 117 is configured to partially complement (i.e. at least partially or fully cancel out) the change in voltage caused by the control MOSFET 116.

Figure 2:
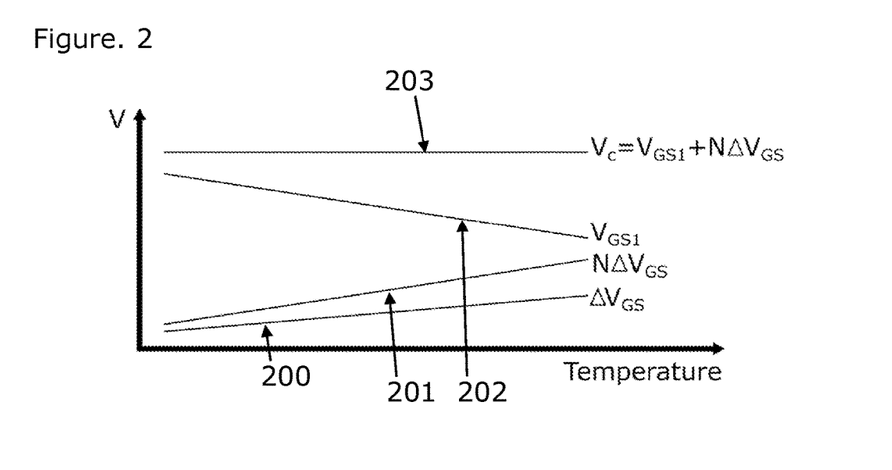
FIG. 2 shows an example graph showing the temperature coefficient with voltage of a control MOSFET, a cascade structure and a cascade cell of the cascade structure in respect of constant biasing currents.

Example FIG. 2 shows the voltage across the components when considering a stable output current on a y-axis and temperature across the x-axis. Plot 200 shows the relationship for a single cascaded cell 120, 121, 122, i.e the variation of $\Delta V_{GS}$ with temperature. Plot 201 shows the relationship for the sum of single cascaded cells 120, 121, 122, i.e. the variation of $N \cdot \Delta V_{GS}$ with temperature. Plot 202 shows the relationship for the control MOSFET 116, i.e. the variation of $V_{GS\_control\_MOSFET}$ with temperature. For the example embodiments described herein, the voltage at capacitor 103 is given by $Vc = V_{GS\_control\_MOSFET} + N \cdot \Delta V_{GS}$ and the variation of Vc with temperature is shown as plot 203. Thus, plot 203 shows that the sample and hold circuit of FIG. 1 and FIG. 3 described below may provide a stable output current at 104 despite variations of temperature during the hold phase.

In the example of FIG. 1, the control MOSFET 116 has a gate terminal 123, a drain terminal 124 and a source terminal 125, wherein said gate terminal 123 is coupled to the sampling node 104, the drain terminal 124 is coupled to said the connection 110, which is the input of the current mirror circuit 107, and the source terminal 125 is coupled to the cascade structure 117. In particular, the source terminal is coupled to one of the pair of MOSFETs of a first 120 of the one or more cascaded cells.

Figure 3:
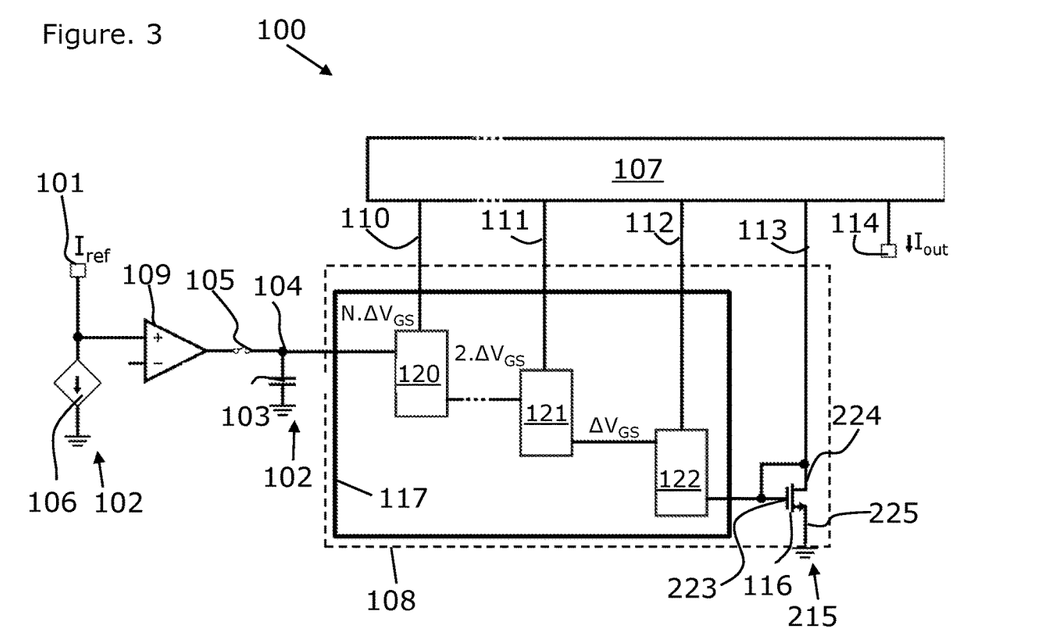
FIG. 3 shows a second example embodiment of a sample and hold circuit.

The example of FIG. 3 is substantially similar to that of FIG. 1 and the same reference numerals have been used. The difference between example FIG. 1 and example FIG. 3 is the transistor arrangement 108. In particular, in FIG. 3, the cascade structure 117 is provided between the sampling node 104 and the control MOSFET 116, whereas in FIG. 1, the control MOSFET 116 is provided between the sampling node 104 and the cascade structure 117.

Further, in example FIG. 3, the control MOSFET 116 has a gate terminal, a drain terminal 224 and a source terminal 225. The gate terminal 223 and the drain terminal 224 are coupled to a first 122 of the one or more cascaded cells, and the source terminal 225 is coupled to said reference voltage node 215.

Figures 4, 5:
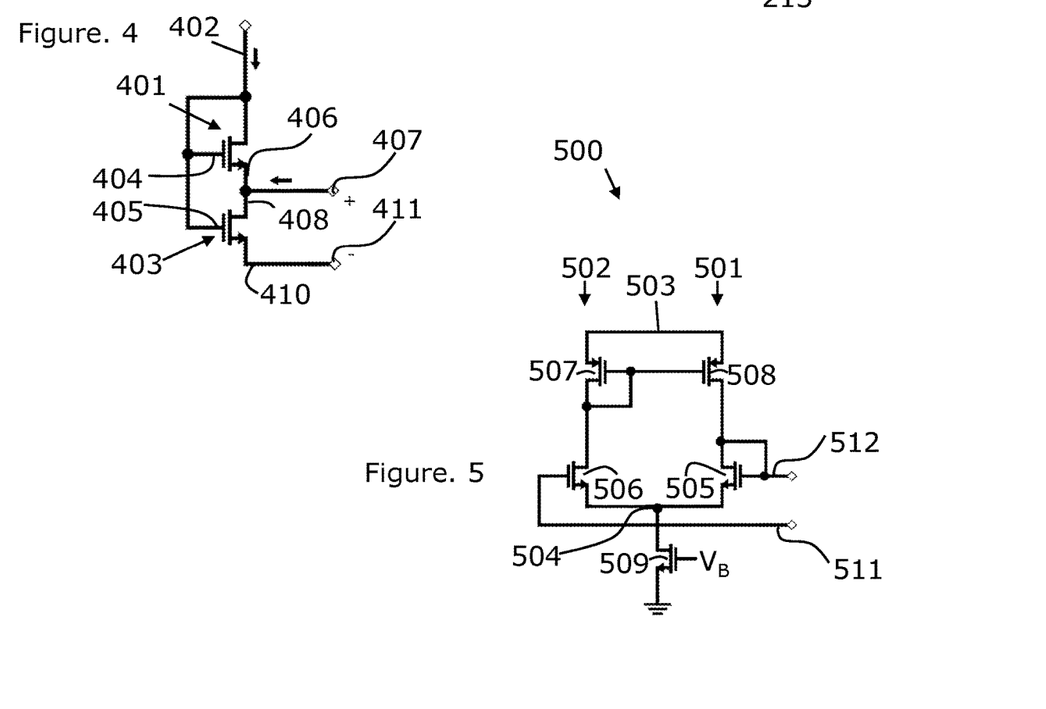
FIG. 4 shows a first example embodiment of the one or more cascaded cells of the cascade structure.
FIG. 5 shows a second example embodiment of the one or more cascaded cells of the cascade structure.

Example FIGS. 4 and 5 provide two different example structure of the one or more cascaded cells 120, 121, 122.

In particular, each of the one or more cascaded cells may comprise a first MOSFET 401 having a drain terminal 402 coupled to said one of said plurality of connections 110, 111, 112 of the current mirror circuit 107 and a second MOSFET 403, wherein a gate terminal 404 of the first MOSFET and a gate terminal 405 of the second MOSFET 403 are coupled to the drain terminal 402 of the first MOSFET 401. A source terminal 406 of the first MOSFET 401 is coupled to a first cell terminal 407. A drain terminal 408 of the second MOSFET 403 is coupled to said first cell terminal 407 and a source terminal 410 of the second MOSFET 403 provides a second cell terminal 411. The first cell terminal 407 and said second cell terminal 411 are configured to provide connection to and from said cascaded cell. Thus, for cascaded cells 120 and 122 at the ends of the chain, the first cell terminal 407 and said second cell terminal 411 may provide a connection for the cascade structure 117. For cascaded cells 121 inward of the ends of the chain, the first cell terminal 407 and said second cell terminal 411 may provide a connection to other cascaded cells 120 and 122 of the chain.

Figure 6:
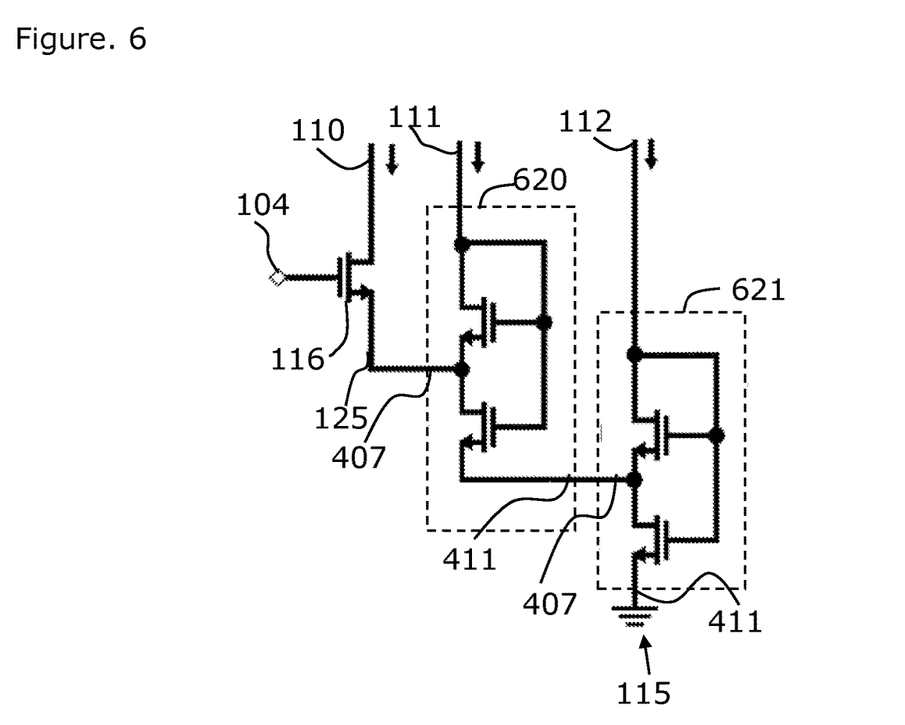
FIG. 6 shows an example transistor arrangement wherein the cascaded cells of the cascade structure have the structure of example FIG. 4.

Example FIG. 6 shows the example structure of FIG. 4 arranged together in chain of two cascaded cells 620 and 621 along with the control MOSFET 116.

For the first cascaded cell 620, said first cell terminal 407 is configured to couple to the source terminal 125 of the control MOSFET 116 and the second cell terminal 411 is configured to couple to the first cell terminal of an adjacent cascaded cell 621 of the chain. Alternatively, if the chain only included one cascaded cell, the second cell terminal 411 is configured to couple to the reference voltage node 115.

For the second cascaded cell 621, said first cell terminal 407 is configured to couple to the second cell terminal 411 of the adjacent, first cascaded cell 620 of the chain and the second cell terminal 411 is configured to couple to reference voltage node 115. Alternatively, if the chain included further cells, the second cell terminal 411 of the second cell 621 would couple to the first cell terminal of an adjacent cascaded cell (not present in this example FIG. 6).

If the chain was longer, with three cells, a cell inward of the ends of the chain would have its first cell terminal 407 configured to couple to the second cell terminal 411 of a first adjacent cascaded cell of the chain. Further, for the cell 121 said second cell terminal 407 is configured to couple to the first cell terminal 411 of a second adjacent cascaded cell of the chain.

It will be appreciated that the size of the MOSFETs needs to be selected based on the current requirements. For example, the second MOSFET 405 of the first cell 620 is expected to handle the current I from the current mirror circuit received from the control MOSFET 116 and the current I received from the current mirror 107 that passes through the first MOSFET 401 of the first cell 620, i.e. 2I.

For example, the second MOSFET 405 of the second cell 621 is expected to handle the current 2.I from the current mirror circuit received from the first cascaded cell 620 and the current I received from the current mirror 107 that passes through the first MOSFET 401 of the second cell 620, i.e. 3.I.

Referring to example FIG. 5, a cascaded cell may comprise a parallel arrangement 500 of a first branch 501 and a second branch 502 coupled at a first end node 503 and a second end node 504. The first branch 501 comprises a first MOSFET 505 and a fourth MOSFET 508 and the second branch 502 comprises a second MOSFET 506 and a third MOSFET 507. A source terminal of the fourth MOSFET 508 is coupled to the first end node 503 and a drain terminal of the fourth MOSFET 508 is coupled to a drain terminal of the first MOSTFET 505. A source terminal of the first MOSFET 505 is coupled to the second end node 504, i.e. the point where the first branch and second branch couple together.

A source terminal of the third MOSFET 507 is coupled to the first end node 503 and a drain terminal of the third MOSFET 507 is coupled to drain terminal of the second MOSTFET 506 and a source terminal of the second MOSFET is coupled to the second end node 504. The gate terminals of both the third MOSFET 507 and the fourth MOSFET 508 are both coupled together and to the drain terminal of the third MOSFET 507. The drain terminal and the gate terminal of the first MOSFET 505 are coupled together.

A fifth MOSFET 509 is shown, which comprises part of the current mirror circuit 107, which sinks current from each cascaded cell. A drain terminal of the fifth MOSFET 509 is coupled to the second end node 504.

A gate terminal of the second MOSFET 506 provides a first cell terminal 511 and the gate terminal of the first MOSFET 505 (which is also coupled to the drain of the first MOSFET) provides a second cell terminal 512. It will be appreciated that the voltage difference between the first cell terminal and second cell terminal represents the difference between the gate-source voltage of transistor 505 and the gate-source voltage of transistor 506. Accordingly, using the notation above, the voltage difference between the first cell terminal and second cell terminal represents $\Delta V_{GS}$. In other examples, the voltage difference provided by the cell may comprise the voltage between the second cell terminal and the first cell terminal and therefore represents the difference between the gate-source voltage of transistor 506 and the gate-source voltage of transistor 505. Thus, more generally, the voltage difference provided by the cell may be considered the modulus $|\Delta VGS|$.

Figure 7:
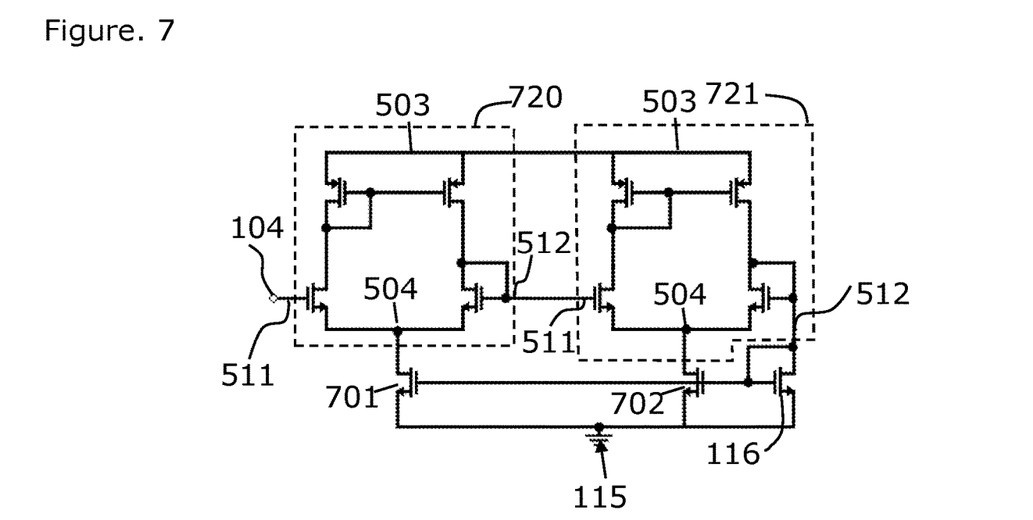
FIG. 7 shows a first example transistor arrangement wherein the cascaded cells of the cascade structure have the structure of example FIG. 5.
Figure 8:
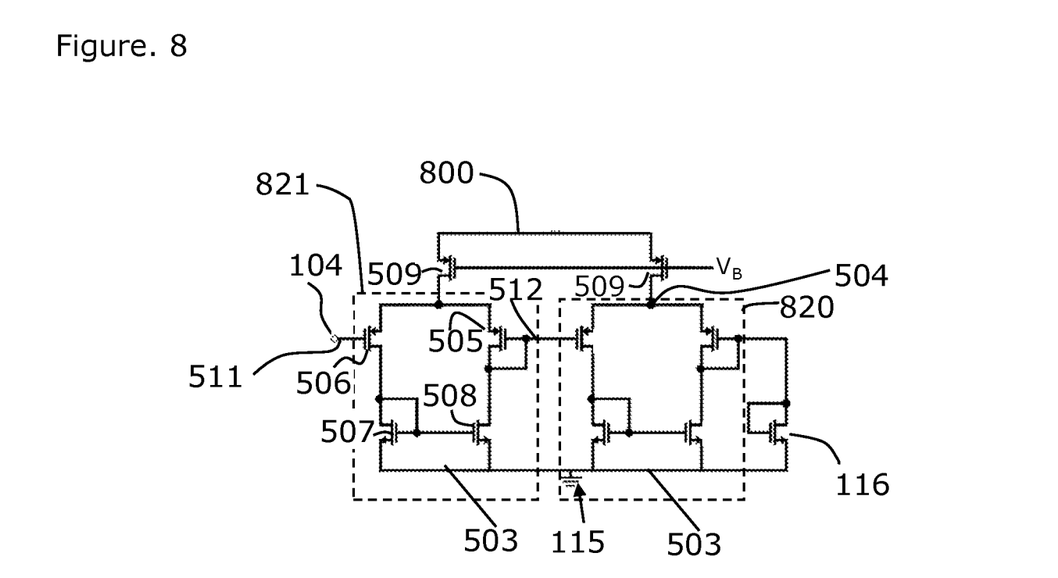
FIG. 8 shows a second example transistor arrangement wherein the cascaded cells of the cascade structure have the structure of example FIG. 5.
Figure 9:
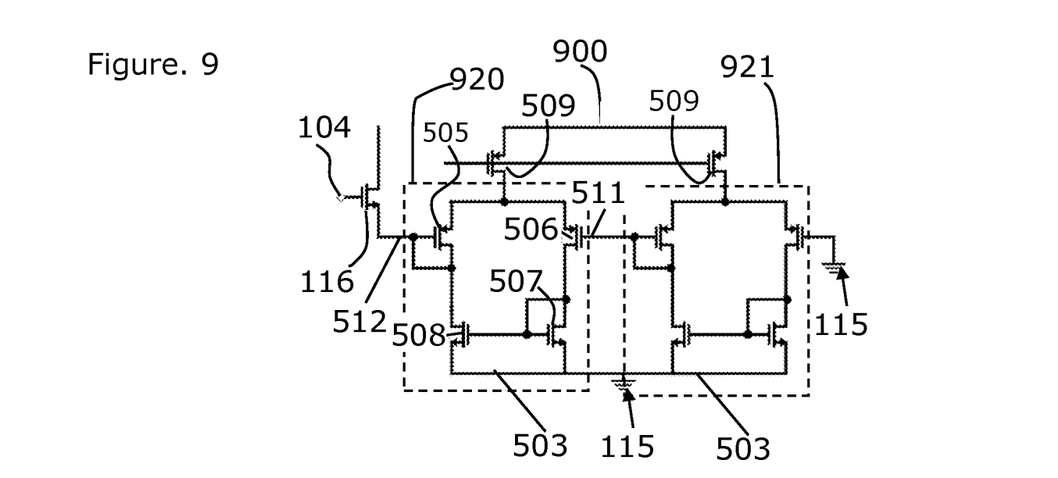
FIG. 9 shows a third example transistor arrangement wherein the cascaded cells of the cascade structure have the structure of example FIG. 5.

Example FIGS. 7, 8 and 9 show examples of the cascade cell 500 of FIG. 5 implemented in the example circuit of FIGS. 1 and 3.

Example FIG. 7 shows the cascaded cells 720 and 721 and current mirror circuit 107 implemented in the example circuit of FIG. 3.

In the example of FIG. 7, a source terminal of the fifth MOSFET 509 is coupled to the reference voltage node 115. The first end node 503 is coupled to a supply voltage Vdd.

The current mirror circuit 107 is provided, at least in part, by fifth MOSFET 701 coupled to the second end node 504 of the cell 720 and the fifth MOSFET 702 coupled to the second end node 504 of the cell 721. The gate terminals of the MOSFETs 701, 702 and the control MOSFET 116 are coupled together and the control MOSFET produces the input current that is mirrored (e.g. sunk) by the MOSFETs 701, 702. Thus, in this example, the control MOSFET 116 serves also as part of the current mirror circuit 107.

Example FIG. 8 shows the cascaded cells 820 and 821 implemented in the example circuit of FIG. 3. Only the cascaded cell 821 is labelled to show the first to fourth MOSFETs along with the fifth MOSFET for clarity.

In the example of FIG. 8 and as mentioned previously, the fifth MOSFET 509 forms part of the current mirror circuit 107 and a source terminal of the fifth MOSFET 509 is coupled to receive a supply voltage Vdd at 800. The first end node 503 is coupled to the reference voltage node 115.

In the example of FIG. 8, the first, second and fifth MOSFETs are P-channel MOSFETs. The third and fourth MOSFETs 507, 508 are N-channel MOSFETs.

Example FIG. 9 shows the cascaded cells 920 and 921 implemented in the example circuit of FIG. 1. Only the cascaded cell 920 is labelled to show the first to fifth MOSFETs for clarity.

In the example of FIG. 9 and as mentioned previously, the fifth MOSFET 509 forms part of the current mirror circuit 107 and a source terminal of the fifth MOSFET 509 is coupled to receive a supply voltage Vdd. The first end node 503 is coupled to the reference voltage node 115.

In the example of FIG. 9, the first, second and fifth MOSFETs 505, 506, 509 are P-channel MOSFETs. The third and fourth MOSFETs 507, 508 are N-channel MOSFETs.

With reference to example FIG. 7, for the first cascaded cell 720 in the chain, said first cell terminal 511 is configured to couple to the sampling node 104 and the second cell terminal 512 is configured to couple to the first cell terminal 511 of an adjacent cascaded cell (i.e. cell 721) of the chain. If there is only one cascaded cell in the chain, the second cell terminal 512 may couple directly to a gate terminal and a drain terminal of the control MOSFET 116.

With reference to example FIG. 7, for the second cascaded cell 721 in the chain, the first cell terminal 511 is configured to couple to the second cell terminal 512 of an adjacent cascaded cell of the chain (i.e. cell 720) and the second cell terminal 512 is coupled to a gate terminal and a drain terminal of the control MOSFET.

It will be appreciated that for a cascaded cell that is intermediate two other cells, then said second cell terminal 512 is configured to couple to a first cell terminal 511 of an adjacent cascaded cell in the chain on one side and the first cell terminal 511 is configured to couple to the second cell terminal 512 on an opposite side.

With reference to example FIG. 9, for the first cascaded cell 920 said second cell terminal 512 is configured to couple to a source terminal of the control MOSFET 116 and the first cell terminal 511 is coupled to the second cell terminal 512 of an adjacent cascaded cell of the chain (i.e. cell 921). If the cascaded cell 920 where the only cascaded cell in the chain, the first cell terminal 511 of the cascaded cell 920 may couple to the reference voltage node 115.

With reference to example FIG. 9, for the second cascaded cell 921 said second cell terminal 512 is configured to couple to a first cell terminal 511 of an adjacent cascaded cell in the chain (i.e. cell 920) and the first cell terminal 511 is configured to couple to the reference voltage node 115.

It will be appreciated that for a cascaded cell that is intermediate two other cells, then said second cell terminal 512 is configured to couple to a first cell terminal 511 of an adjacent cascaded cell in the chain on one side and the first cell terminal 511 is configured to couple to the second cell terminal 512 on an opposite side.

Figure 10:
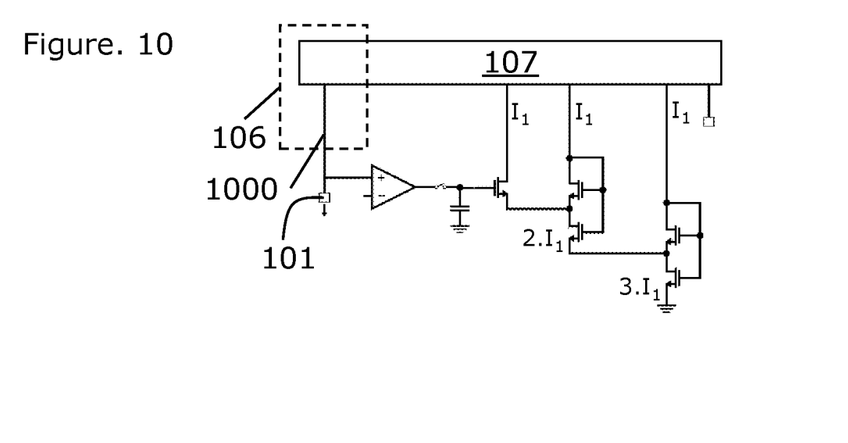
FIG. 10 shows a first example of the controlled current source.
Figure 11:
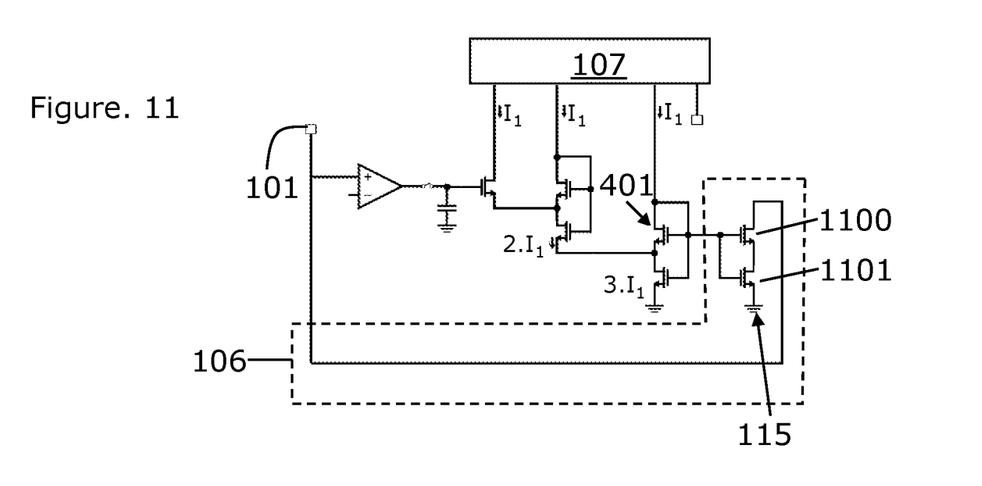
FIG. 11 shows a second example of the controlled current source.
Figure 12:
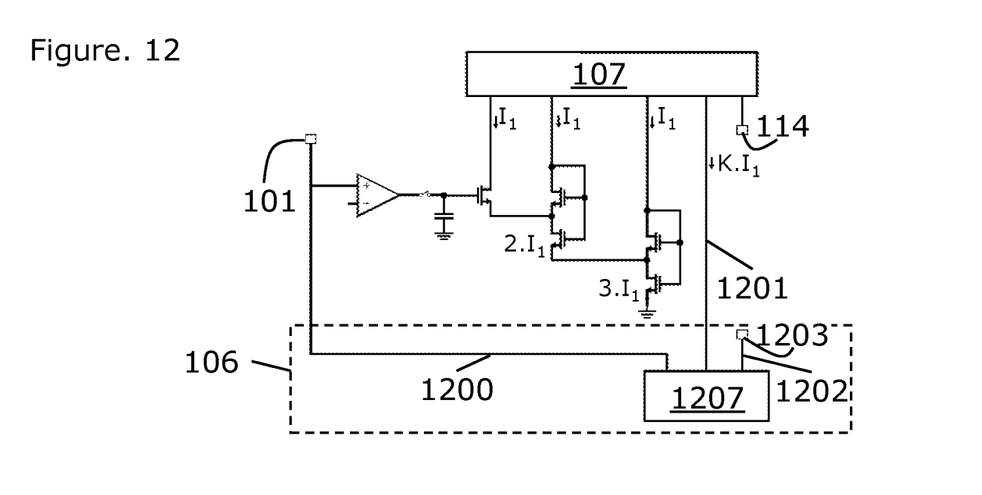
FIG. 12 shows a third example of the controlled current source.

Example FIGS. 10, 11 and 12 shows different embodiments of the controlled current source 106 of FIGS. 1 and 3.

With reference to example FIG. 10, the controlled current source 106 may be provided by the current mirror circuit 107 such that said one of said plurality of connections 1000 of the current mirror circuit 107 is coupled to the input node 101. In this arrangement, the current-to-be-sampled is sunk from the input node 101 by whatever circuitry generates said current-to-be-sampled.

With reference to example FIG. 11, the controlled current source 106 may comprise a first MOSFET 1100 having a drain terminal coupled to said input node 101 and a source terminal coupled to a drain terminal of a second MOSFET 1101. The source terminal of the second MOSFET 1101 is coupled to the reference voltage node 115. The gate terminals of both the first MOSFET 1100 and the second MOSFET 1101 are coupled together. Further, the gate terminals of both the first MOSFET 1100 and the second MOSFET 1101 are coupled to the gate terminal of the first MOSFET 401 of one of the one or more cascaded cells and, in particular to the first MOSFET 401 of a final cascaded cell in the chain.

With reference to example FIG. 12, the controlled current source 106 may comprise a further current mirror circuit 1207 having a first leg 1200 coupled to the input node 101 and a second leg 1201 coupled to said one of said plurality of connections of the current mirror circuit 107.

In this example, the further current mirror circuit 1207 optionally includes a third leg 1202 configured to provide the same (i.e. mirrored) current as the first leg 1200 and the second leg 1201, wherein the third leg 1202 includes a terminal 1203 comprising a second output node of the sample and hold circuit 100. This arrangement may be advantageous as the first output node 114 provides the output current while the second output node 1203 sinks the output current. Accordingly, the further current mirror circuit 1207 can also be considered to be part of the current mirror circuit 107 in that it provides the output current of the sample and hold circuit 100.

Figure 13:
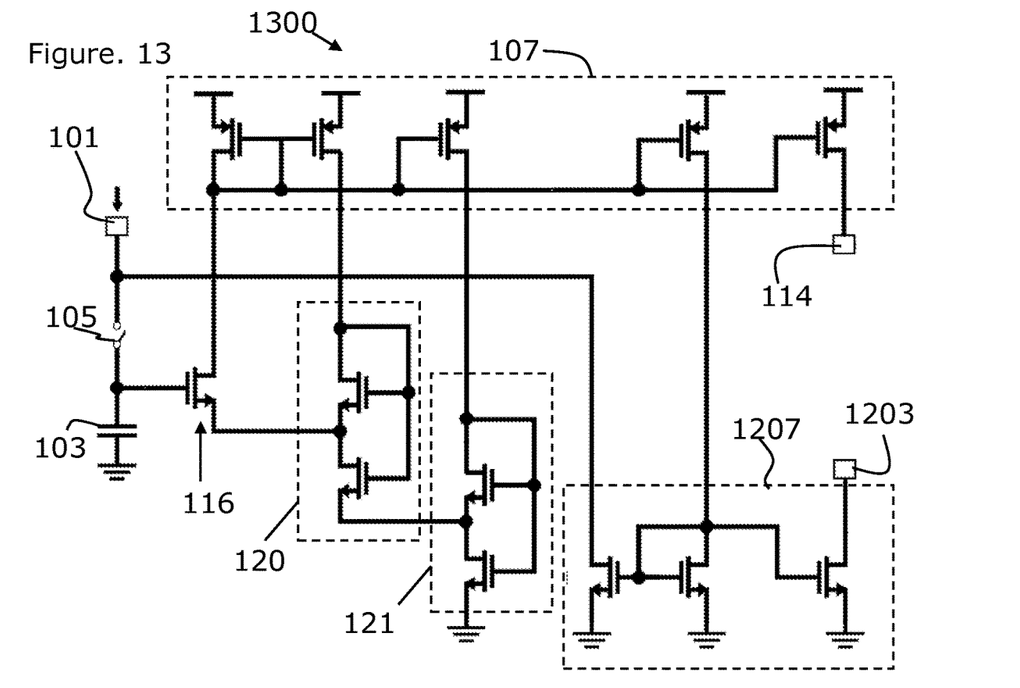
FIG. 13 shows a third example of the controlled current source.

Example FIG. 13 shows a third embodiment of the sample and hold circuit 1300. In this example, the sample and hold circuit 1300 has the general form of example FIG. 1 but is absent the optional amplifier 109. The cascaded cells 120, 121 have the form of example FIG. 4. The controlled current source has the form of example FIG. 12 and provides the optional second output node 1203. The structure of the current mirror circuit 107 is shown in more detail wherein the MOSFETs are coupled to a voltage source at their source terminals, Vdd. The structure of the second current mirror circuit 1207 is also shown in more detail.

Figure 14:
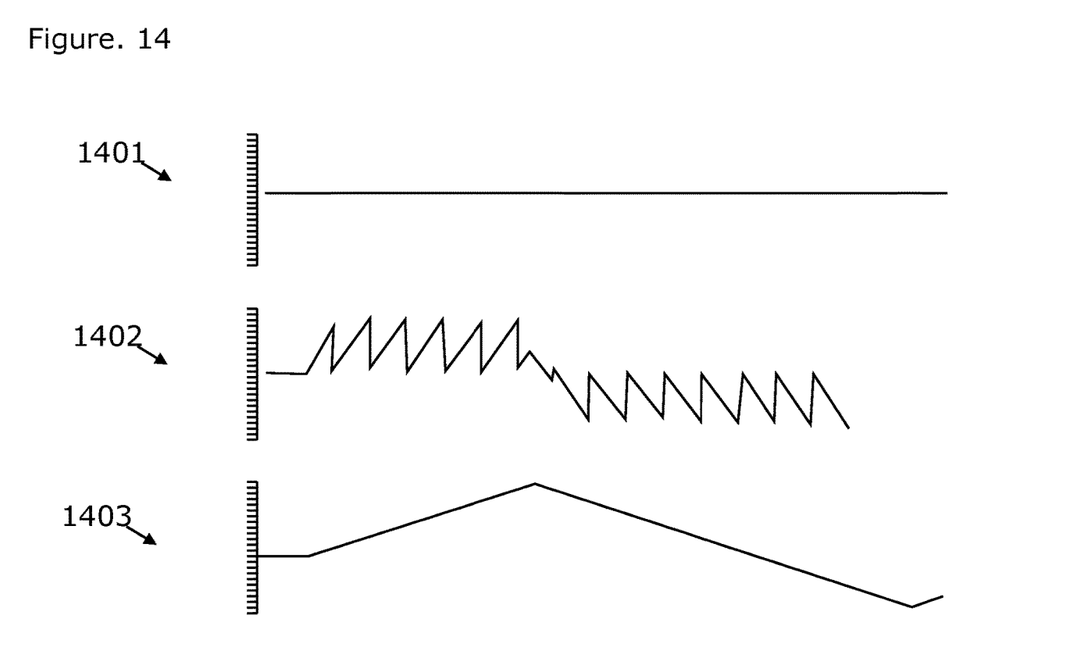
FIG. 14 shows an example graph illustrating the operation of the sample and hold circuit in a temperature variable environment in comparison with a typical prior art implementation.

FIG. 14 shows a graph showing a first trace 1401 showing the variation in the output current during transient changes in temperature represented by third trace 1403. Trace 1402 shows the output current during changes in temperature represented by third trace 1403 for a typical prior art current sample and hold circuit. As can be seen, example embodiments of the sample and hold circuit of the disclosure may provide more stable current output during changes in temperature. In this example, the new sample is made every 16 ms.

Figure 15:
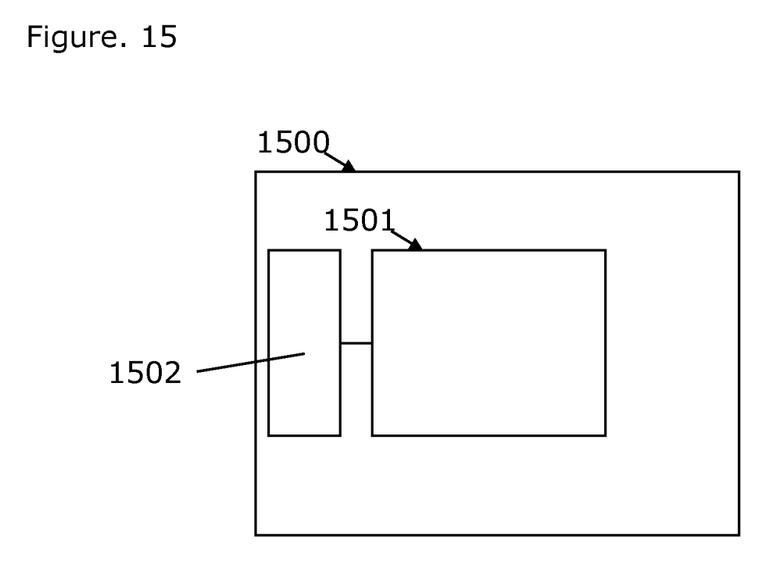
FIG. 15 shows an example device including the sample and hold circuit.

FIG. 15 shows a device 1500 including the sample and hold circuit 1501 of any of the embodiments described herein and a current reference source circuit 1502 configured to provide the current to be sampled at the input node. In the hold phase, the current reference source circuit 1502 may be switched off and the sample and hold circuit 1501 holds the current for use by other components, thereby saving the power of the current reference source circuit 1502.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A sample and hold circuit configured to sample a current comprising:
an input node configured to receive the current to be sampled;
a reference voltage node configured to be coupled to a reference voltage;
a capacitor having a first plate coupled with a sampling node and a second plate coupled to the reference voltage node;
a switch configured to open and close a connection between the input node and the sampling node;
a controlled current source having a first terminal coupled to said input node and a second terminal coupled to the reference voltage node;
a current mirror circuit having a plurality of connections each providing the same or a proportional mirrored current, wherein at least one of said plurality of connections provides an output node of said sample and hold circuit;
a transistor arrangement coupled between the sampling node and the reference voltage node, the transistor arrangement comprising a control MOSFET coupled in series with a cascade structure, the cascade structure comprising one or more cascaded cells coupled in a series connected chain, wherein said control MOSFET is coupled to one of said plurality of connections of the current mirror circuit and each of said cascaded cells are coupled to one of said plurality of connections of the current mirror circuit, each of the one or more cascaded cells comprising at least a pair of MOSFETs arranged to provide a voltage difference between a first cell terminal and a second cell terminal of the cascaded cell, the voltage difference comprising a difference between a gate-source voltage of a first of the pair and a gate-source voltage of a second of the pair wherein said first cell terminal and said second cell terminal provide at least connections to either an adjacent cascaded cell in said series connected chain or, for one of the cascaded cells at an end of the series connected chain, to the control MOSFET; wherein
the sample and hold circuit is configured to operate in a sample phase in which said switch is closed and the controlled current source is configured to provide a current based on the current provided at the plurality of connections of the current mirror circuit and wherein a closed-loop is formed by the transistor arrangement, the current mirror circuit and the current controlled current source wherein, by feedback, the capacitor is charged to a voltage, Vc, that results in the current provided by the controlled current source being equal to the current to be sampled; and
wherein the sample and hold circuit is configured to operate in a hold phase in which said switch is open and the voltage at the capacitor applied to said transistor arrangement provides for output of an output current at the output node representative of the sampled current.

2. The sample and hold circuit of claim 1 wherein
the control MOSFET has a negative temperature coefficient thereby acting to increase the current at the output node for a given voltage at the capacitor with increasing temperature; and
the one or more cascaded cells have a positive temperature coefficient thereby acting to decrease the current at the output node for a given voltage at the capacitor with increasing temperature; and
wherein a net temperature coefficient of the cascade structure is configured to be one or more of: greater than that of the temperature coefficient of the control MOSFET; and
substantially equal to the magnitude of the temperature coefficient of the control MOSFET.

3. The sample and hold circuit of claim 1 wherein one or more cascaded cells comprises:
a first MOSFET having a drain terminal coupled to said one of said plurality of connections of the current mirror circuit and a second MOSFET, wherein a gate terminal of the first MOSFET and a gate terminal of the second MOSFET are coupled to the drain terminal of the first MOSFET, and wherein a source terminal of the first MOSFET is coupled to a first cell terminal, a drain terminal of the second MOSFET is coupled to said first cell terminal and a source terminal of the second MOSFET provides a second cell terminal, said first cell terminal and said second cell terminal providing connections to and from said cascaded cell.

4. The sample and hold circuit of claim 3 wherein, based on a position of the cascaded cell in the chain, one of:
said first cell terminal is configured to couple to a source terminal of the control MOSFET and the second cell terminal is configured to couple to the first cell terminal of an adjacent cascaded cell of the chain or the reference voltage node; and
said first cell terminal is configured to couple to a second cell terminal of an adjacent cascaded cell of the chain and the second cell terminal is configured to couple to the first cell terminal of an adjacent cascaded cell or the reference voltage node.

5. The sample and hold circuit of claim 1 wherein one of:
the sample and hold circuit is configured such that the current to be sampled is input at the input node and the controlled current source is configured to sink current, wherein, in the sample phase, the capacitor voltage comprising Vc results in the current sunk by the controlled current source being equal to the current input at the input node; and
the sample and hold circuit is configured such that the current to be sampled is sunk from the input node and the controlled current source is configured to input current, wherein, in the sample phase, the capacitor voltage comprising Vc results in the current input by the controlled current source being equal to the current sunk at the input node.

6. The sample and hold circuit of claim 1 wherein one or more cascaded cells comprises:
a parallel arrangement of a first branch and a second branch coupled at a first end node and a second end node, wherein the first branch comprises a first MOSFET and a fourth MOSFET and the second branch comprises a second MOSFET and a third MOSFET, wherein a source terminal of the fourth MOSFET is coupled to the first end node and a drain terminal of the fourth MOSFET is coupled to drain terminal of the first MOSTFET and a source terminal of the first MOSFET is coupled to the second end node where the first branch and second branch couple together, wherein a source terminal of the third MOSFET is coupled to the first end node and a drain terminal of the third MOSFET is coupled to drain terminal of the second MOSTFET and a source terminal of the second MOSFET is coupled to the second end node, wherein gate terminals of both the third MOSFET and the fourth MOSFET are both coupled to the drain terminal of the third MOSFET, wherein the drain terminal and the gate terminal of the first MOSFET are coupled together, and wherein a gate terminal of the second MOSFET provides a first cell terminal and the gate terminal of the first MOSFET provides a second cell terminal.

7. The sample and hold circuit of claim 6 wherein based on a position of the cascaded cell in the chain, one of:

said second cell terminal is configured to couple to a source terminal of the control MOSFET and the first cell terminal is coupled to the second cell terminal of an adjacent cascaded cell of the chain or the reference voltage node; and said second cell terminal is configured to couple to a first cell terminal of an adjacent cascaded cell in the chain and the first cell terminal is configured to couple to the reference voltage node.

8. The sample and hold circuit of claim 6 wherein based on a position of the cascaded cell in the chain, one of:

said first cell terminal is configured to couple to the sampling node and the second cell terminal is configured to couple to the first cell terminal of an adjacent cascaded cell of the chain or is coupled to a gate terminal and a drain terminal of the control MOSFET; and the first cell terminal is configured to couple to the second cell terminal of an adjacent cascaded cell of the chain and the second cell terminal is coupled to a gate terminal and a drain terminal of the control MOSFET.

9. The sample and hold circuit of claim 1, wherein one of:

(i) the control MOSFET has a gate terminal, a drain terminal and a source terminal, wherein said gate terminal is coupled to the sampling node, the drain terminal is coupled to said one of said plurality of connections of the current mirror circuit and the source terminal is coupled to a first of the one or more cascaded cells; and (ii) the control MOSFET has a gate terminal, a drain terminal and a source terminal, wherein said gate terminal and the drain terminal are coupled to a first of the one or more cascaded cells, and the source terminal is coupled to said reference voltage node.

10. The sample and hold circuit of claim 3, wherein the controlled current source comprises:

a first MOSFET having a drain terminal coupled to said input node and a source terminal coupled to a drain terminal of a second MOSFET, wherein the source terminal of the second MOSFET is coupled to the reference voltage node, and wherein gate terminals of both the first MOSFET and the second MOSFET are coupled to the gate terminal of the first MOSFET of one of the one or more cascaded cells.

11. The sample and hold circuit of claim 1, wherein the controlled current source is provided by the current mirror circuit such that said one of said plurality of connections of the current mirror circuit is coupled to the input node.

12. The sample and hold circuit of claim 1, wherein the current mirror circuit includes a further current mirror circuit part and the controlled current source is provided by said further current mirror circuit part, the further current mirror circuit part having a first leg coupled to the input node and a second leg coupled to said one of said plurality of connections of the current mirror circuit.

13. The sample and hold circuit of claim 12, wherein the further current mirror circuit part includes a third leg configured to provide the same or a proportional current as the first leg and the second leg, wherein the third leg includes a terminal comprising one of: the output node of the sample and hold circuit or a second output node of the sample and hold circuit, wherein the third leg thereby comprises one of the plurality of connections of the current mirror circuit.

14. The sample and hold circuit of claim 1, wherein an amplifier is provided between the input node and the sampling node, the amplifier having a first terminal coupled to the input node and the controlled current source and a second terminal coupled to receive a bias voltage, an output of the amplifier coupled to the sampling node.

15. A device including the sample and hold circuit of claim 1 and a current reference source circuit configured to provide the current to be sampled at the input node and wherein in the hold phase, the current reference source circuit is unpowered.

* * * * *